(12) United States Patent
Banaska et al.

(10) Patent No.: US 8,903,687 B1
(45) Date of Patent: Dec. 2, 2014

(54) DIELECTRIC ABSORPTION COMPENSATION FOR A MEASUREMENT INSTRUMENT

(75) Inventors: John G. Banaska, Wadsworth, OH (US); Gregory Roberts, Cleveland, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 1923 days.

(21) Appl. No.: 11/840,600

(22) Filed: Aug. 17, 2007

(51) Int. Cl.
*G06G 7/48* (2006.01)
*G06F 17/50* (2006.01)

(52) U.S. Cl.
CPC .............. *G06G 7/48* (2013.01); *G06F 17/5022* (2013.01); *G06F 17/5036* (2013.01)
USPC .................. 703/4; 703/14; 327/341; 327/345; 330/270; 330/271; 330/282; 324/663; 324/665; 324/669; 324/684

(58) Field of Classification Search
USPC ................ 703/4, 14; 324/76.11, 76.16, 76.79, 324/658, 663, 665, 669, 684, 714; 327/341, 327/345; 330/270, 271, 282
See application file for complete search history.

(56) References Cited

U.S. PATENT DOCUMENTS

| | | | | | |
|---|---|---|---|---|---|
| 3,564,396 | A | * | 2/1971 | Beerbom | 330/85 |
| 4,549,146 | A | * | 10/1985 | Cowans et al. | 330/149 |
| 4,622,660 | A | * | 11/1986 | Cowans et al. | 369/134 |
| 5,519,328 | A | * | 5/1996 | Bennett | 324/684 |
| 5,557,242 | A | * | 9/1996 | Wetherell | 331/17 |
| 5,579,236 | A | * | 11/1996 | Tamamura et al. | 702/64 |
| 5,585,756 | A | * | 12/1996 | Wang | 327/341 |
| 5,773,990 | A | * | 6/1998 | Wilstrup et al. | 324/765 |
| 6,239,643 | B1 | * | 5/2001 | Takatsu | 327/307 |
| 6,294,945 | B1 | * | 9/2001 | Regier et al. | 327/341 |
| 6,317,001 | B1 | * | 11/2001 | Roth | 330/289 |
| 6,934,672 | B2 | * | 8/2005 | Hesse | 703/14 |
| 7,183,854 | B2 | * | 2/2007 | Regier et al. | 330/284 |
| 7,595,681 | B2 | * | 9/2009 | Awad et al. | 327/513 |
| 7,624,360 | B2 | * | 11/2009 | Akselrod et al. | 716/106 |
| 2002/0017952 | A1 | * | 2/2002 | Nakai et al. | 330/129 |
| 2004/0041599 | A1 | * | 3/2004 | Murphy | 327/129 |
| 2008/0115095 | A1 | * | 5/2008 | Akselrod et al. | 716/4 |

OTHER PUBLICATIONS

"The American Heritage College Dictionary", Fourth Edition, Copy Right 2002, 3 pgs.*

* cited by examiner

*Primary Examiner* — Kibrom K Gebresilassie
(74) *Attorney, Agent, or Firm* — Pearne & Gordon LLP

(57) ABSTRACT

A method for compensating for a dielectric absorption effect in a measurement configuration during measurements by an instrument having measurement terminals includes providing a feedback loop in the instrument, the loop having a gain adjustment and a simulation impedance and being adapted to provide a signal counter to the dielectric absorption at the measurement terminals; applying a transient calibration signal to the test terminals for at least two values of the gain adjustment; measuring a response to the calibration signal for each of the at least two values; and determining an operating value of the gain adjustment based on the measured responses. The operating value is used for subsequent measurements by the instrument, the simulation impedance modeling the dielectric absorption characteristics of the measurement configuration.

7 Claims, 2 Drawing Sheets

DIELECTRIC ABSORPTION COMPENSATION FOR A MEASUREMENT INSTRUMENT

BACKGROUND OF THE INVENTION

The present invention relates to electrical measurements and, in particular, minimizing undesirable dielectric absorption effects.

Dielectric absorption may be considered to be the undesired absorption of charge by dielectric materials. This is often noticed in capacitors, but it is present in dielectric material used in electrical apparatus in general (e.g., circuit boards, insulation and cabling). The dielectric absorption typically manifests itself as a long time constant capacitive effect. In DC measurement systems, this often requires substantial delays, or settling times, before measurements can be made without being degraded by the dielectric absorption. If dielectric absorption effects can be minimized or compensated for, measurement speed and accuracy can be increased.

SUMMARY OF THE INVENTION

A method for compensating for a dielectric absorption effect in a measurement configuration during measurements by an instrument having measurement terminals includes providing a feedback loop in the instrument, the loop having a gain adjustment and a simulation impedance and being adapted to provide a signal counter to the dielectric absorption at the measurement terminals; applying a transient calibration signal to the test terminals for at least two values of the gain adjustment; measuring a response to the calibration signal for each of the at least two values; and determining an operating value of the gain adjustment based on the measured responses. The operating value is used for subsequent measurements by the instrument, the simulation impedance modeling the dielectric absorption characteristics of the measurement configuration.

DESCRIPTION OF THE PREFERRED EMBODIMENTS

Figure 1:
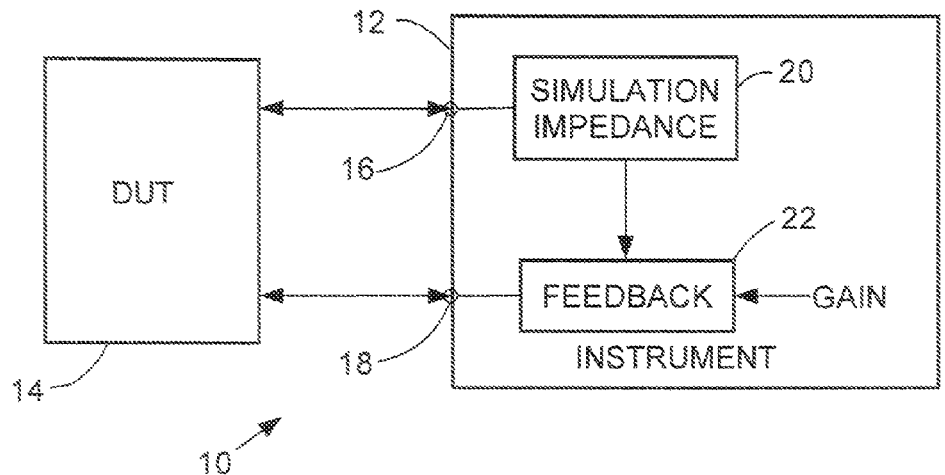
FIG. 1 is a block diagram of an example of a measurement configuration suitable for practicing an aspect of the invention.

Referring to FIG. 1, a measurement configuration 10 includes an instrument 12 and device under test (DUT) 14. The DUT 14 is connected to the instrument 12 by cabling connected to measurement terminals 16, 18 of the instrument 12.

The measurement configuration 10 has a dielectric absorption effect that is a combination of dielectric absorption in the instrument 12, the DUT 14 and the cabling connecting them. The simulation impedance 20 models the dielectric absorption effect of the measurement configuration 10 and is used to provide a feedback 22 that counters the dielectric absorption effect.

The instrument 12 may be, for example, a voltmeter, an ammeter, a current source, a voltage source, a source measure unit, or similar electrical test instrument used for applying signals to a DUT and measuring a response.

The gain of the feedback 22 is adjusted by applying a transient calibration signal to the terminals 16, 18 at two different values of the gain. Based on the response in each case, the gain is set to an operating value for subsequent measurements by the instrument 12. The feedback loop compensates for the dielectric absorption effect in the measurement configuration 10.

The transient calibration signal may be, for example, a step function, a ramp, or other time-varying signal suitable for producing a response indicative of the dielectric absorption effect.

Figure 2:
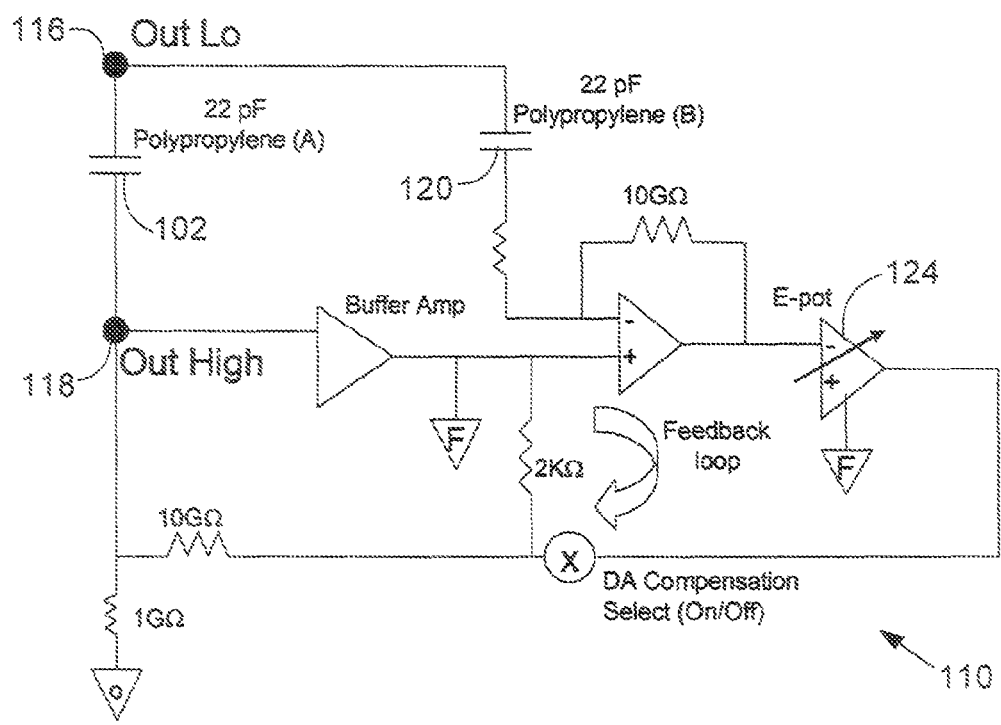
FIG. 2 is a schematic diagram of an example of the output section of a measurement instrument having an output capacitor with compensated dielectric absorption.

Referring to FIG. 2, the output section of an instrument 110 includes a capacitor 102 between the instrument output terminals 116, 118. Such an arrangement is common in instruments (e.g., source measure units). Though typically very high quality, the capacitor 102 still has significant dielectric absorption.

To provide a simulation impedance 120, a capacitor identical to the capacitor 102 is used. The simulation impedance 120 is used to model the dielectric absorption to provide a counter feed back signal to the output terminals 116, 118.

The gain of the feedback loop is adjusted with a digitally adjustable potentiometer 124. A step, for example, from −200 volts to +200 volts is applied to the terminals 116, 118 with the gain at, for example, its maximum and at its minimum. For each case, the response to the step is measured at the terminals 116, 118. The actual time of measurement can be chosen, for example, to be at a specific time after the non-dielectric absorption transients have settled but while the dielectric absorption transients are still present. The two response values may then be averaged and the value of the gain adjusted to provide a response equal to this average. This gain value is then used for the subsequent actual measurements with the instrument 110. It may be useful to apply the transient calibration signal additional times so more values may be averaged for a higher confidence in the resulting compensation.

Figure 3:
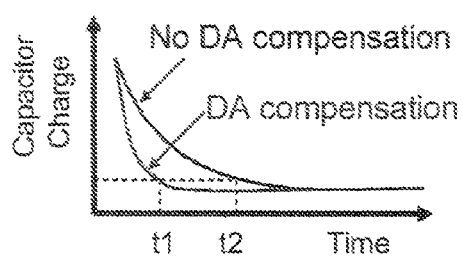
FIG. 3 is a graph of showing an example difference between settling times with and without dielectric absorption compensation

Referring to FIG. 3, a graph shows an example of the improvement in settling time for the capacitor 102 with and without dielectric absorption compensation. For example, t1 may be 2-5 seconds and t2 may be around 30 seconds. This permits a substantial increase in the number of measurements that may be made in a time period.

In the case of FIG. 2, the dielectric absorption compensation is for the dielectric absorption of the capacitor 102, any other dielectric absorption in the measurement configuration is ignored by the compensation. In the case of FIG. 1, the dielectric absorption of interest may be the entire dielectric absorption of the measurement configuration. This may include not only dielectric absorption in the instrument 12, but also external dielectric absorption in the DUT 14 and cabling connecting the two. In such a case, rather than a fixed simulation impedance like the capacitor 120, an electrically controlled impedance may be desirable for use as the simulation impedance 20. This configuration would provide additional opportunity to decrease settling time, increase throughput and improve accuracy.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for compensating for a dielectric absorption effect in a measurement configuration during measurements by an instrument having measurement terminals, said method comprising:
   providing a feedback loop in said instrument, said loop having a gain adjustment and a simulation impedance and being adapted to provide a signal counter to said dielectric absorption effect at said measurement terminals;
   applying a transient calibration signal to said test terminals for at least two values of said gain adjustment;
   measuring a response to said calibration signal for each of said at least two values; and
   determining an operating value of said gain adjustment based on said measured responses, said operating value being used for subsequent measurements by said instrument, wherein said simulation impedance models the dielectric absorption characteristics of the measurement configuration.

2. A method according to claim 1, wherein said instrument includes an output terminal capacitor and said simulation impedance is a capacitor identical to said output terminal capacitor.

3. A method according to claim 1, wherein said transient calibration signal is a step function.

4. A method according to claim 1, wherein said measured responses are each measured at a specific time after the application of the transient calibration signal.

5. A method according to claim 1, wherein said operating value corresponds to a setting that provides an operating response that is the average of said measured response.

6. A method according to claim 1, wherein said dielectric absorption effect includes both effects within the instrument and effects in the measurement configuration external to the instrument.

7. A method according to claim 1, wherein said simulation impedance is an electrically controlled impedance.

* * * * *